(12) United States Patent  
Lee

(10) Patent No.: US 7,748,995 B1
(45) Date of Patent: Jul. 6, 2010

(54) USB APPLICATION DEVICE HAVING A SUPPORTING PORTION PROJECTED FROM THE INNER BOTTOM WALL OF THE CASING

(75) Inventor: Tsung-Shih Lee, Taipei (TW)

(73) Assignee: Cheng Uei Precision Industry Co., Ltd., Taipei (TW)

( * ) Notice: Subject to any disclaimer, the term of this patent is extended or adjusted under 35 U.S.C. 154(b) by 0 days.

(21) Appl. No.: 12/536,489

(22) Filed: Aug. 6, 2009

(51) Int. Cl.
*H01R 12/00* (2006.01)
(52) U.S. Cl. .................................... 439/76.1
(58) Field of Classification Search ................ 439/76.1
See application file for complete search history.

(56) References Cited

U.S. PATENT DOCUMENTS 7,008,240 B1 * 3/2006 Wang et al. ............... 439/76.1
7,052,287 B1 * 5/2006 Ni et al. .................... 439/76.1
7,249,978 B1 * 7/2007 Ni ............................. 439/660
7,359,208 B2 * 4/2008 Ni ............................. 361/752

* cited by examiner

*Primary Examiner*—Tho D Ta

(57) ABSTRACT

An USB application device includes a casing having a top wall, a bottom wall, a fixing wall extended from the top wall and towards the bottom wall and an opening formed between the bottom wall and a bottom edge of the fixing wall, a PCB having a top surface, a bottom surface, a front end portion and a rear end portion, contacts disposed on the top surface of the front end portion, and an IC having a printed surface, and fixed on the second surface of a portion of the PCB and between the front and rear end portions. The IC and the portion of the PCB are sandwiched in the opening of the casing. The printed surface of the IC contacts an inner surface of the bottom wall of the casing. The bottom edge of the fixing wall contacts the top surface of the portion of the PCB.

15 Claims, 3 Drawing Sheets

USB APPLICATION DEVICE HAVING A SUPPORTING PORTION PROJECTED FROM THE INNER BOTTOM WALL OF THE CASING

BACKGROUND OF THE INVENTION

1. Field of the Invention

The present invention relates to an USB application device, more specifically, to a miniaturized USB application device.

2. The Related Art

Because Universal serial bus (USB) interface has many advantages such as better convenience, compatibility and transmission speed, it is widely applied to various electronic devices such as personal computers, MP3 players, MP4 players, external storage devices, laptops, flash storage devices, etc. Hence, USB interface becomes one of the standard interfaces of the electronic devices.

A conventional USB compatible application apparatus is disclosed in U.S. Pat. No. 7,165,998. The USB compatible application apparatus has a printed circuit board (PCB) to be inside a connector. A top surface of the PCB carrying board includes a plurality of terminals. A board bottom sandwich is formed between a bottom surface of the PCB carrying board inside the connector and a covering shell of the connector. At least one electrical element is fixed on the bottom surface of the PCB carrying board inside the connector.

Therefore, the USB compatible application apparatus can shorten the length of the USB compatible application device and efficiently raise working efficiency of the USB compatible application device.

Furthermore, the board bottom sandwich has at least one supporting structure, front end protection layer, and a combination thereof capable of connecting to the PCB carrying board. Hence, the supporting structure can fix the size of the board bottom sandwich and prevent the board bottom sandwich from deforming by the outer force. The front end protection layer can protect the electrical element inside the board bottom sandwich and meanwhile efficiently strengthen the structure of the board bottom sandwich.

However, the covering shell is selectively made of non-metal material, e.g. plastic, plasticity steel, or polymer. The strength of the non-metal material covering shell is weaker than the metal shell. Therefore, the board bottom sandwich is arranged for supporting the structure and the front end protection layer for improving structure.

Moreover, the non-metal material covering shell can not comply with electrostatic discharge (ESD) testing standard specification. Therefore, the USB compatible application apparatus can not comply with USB standard specification. Because the electrical element is located under the bottom surface of the PCB carry board, the location of the supporting structure inside the board bottom sandwich must be designed to avoid overlapping the location of the electrical element. Hence, it is complex to design the location of the electrical element and the supporting structure.

SUMMARY OF THE INVENTION

The object of the present invention is to provide an USB application device which has a compact size.

According to the invention, the USB application device has a casing, a printed circuit board, a plurality of contacts and an integrated circuit. The housing includes a top wall, a bottom wall opposite to the top wall, a fixing wall extended from the top wall and towards the bottom wall and an gap formed between a bottom edge of the fixing wall and the bottom wall.

The printed circuit board is received in the casing and includes a top surface, a bottom surface opposite to the top surface, a front end portion and a rear end portion opposite to the front end portion. The contacts are disposed on the top surface of the front end portion of the printed circuit board. The integrated circuit is fixed on the bottom surface of a middle portion of the printed circuit board between the front end portion and the rear end portion of the printed circuit board, and electronically connects to the contacts. The integrated circuit has a printed surface.

The integrated circuit and the portion of the printed circuit board are sandwiched in the gap of the casing. The printed surface of the integrated circuit contacts an inner surface of the bottom wall of the casing. The bottom edge of the fixing wall contacts the top surface of the portion of the printed circuit board.

The front end portion of the printed circuit board is formed as a cantilever type. There is not any supporting element or any front end protecting layer arranged between the bottom surface of the front end portion of the printed circuit board and the bottom wall of the housing casing and supporting the bottom surface of front end portion of the printed circuit board.

Hence, the design resource of the USB application is reduced without considering the location of the supporting element and the front end protecting layer to avoid overlapping the electrical elements on the bottom surface of the printed circuit board. The space is increased to arrange more electrical element to reduce the size of the USB application device.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE PREFERRED EMBODIMENT

Figure 1:
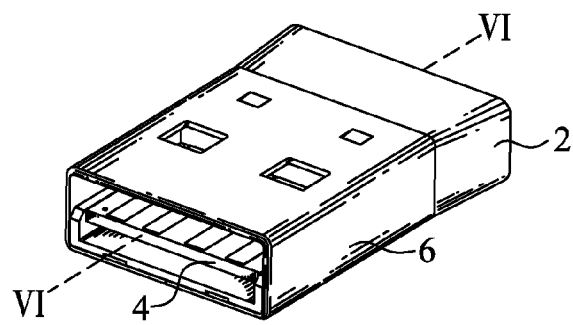
FIG. 1 shows a perspective view of a preferred embodiment of an USB application device according to the present invention.

Please refer to FIG. 1. A preferred embodiment of an USB application device 100 is a wireless USB dongle. The wireless USB dongle is one of standards of Bluetooth, radio-frequency identification (RFID), WiFi, worldwide interoperability for microwave access (WiMAX), ZigBee, global system for mobile communications (GSM), General packet radio service (GPRS), 3rd generation partnership project (3GPP), global positioning system (GPS), etc.

The USB application device 100 has a casing and a PCB 4 received in the casing. The casing has a housing 2 and a shell 6. The housing 2 is made of an isolated material. The shell 6 is made of a metal material.

Figure 2:
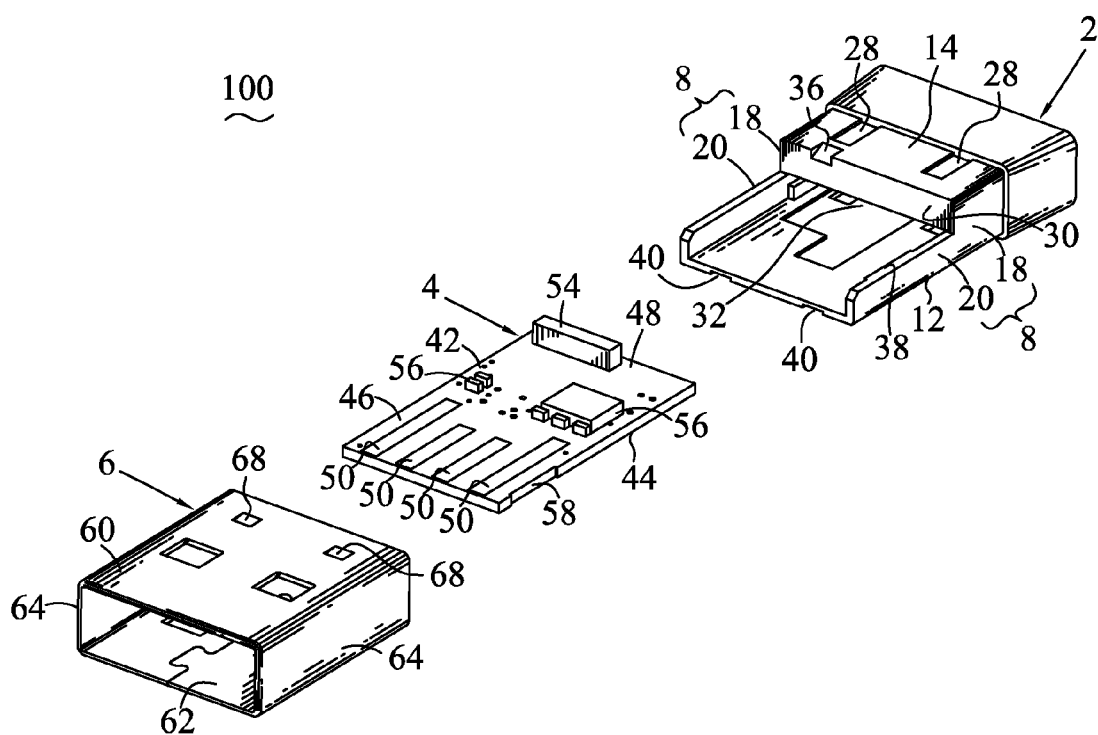
FIG. 2 shows an exploded view of the USB application device according to the present invention.
Figure 3:
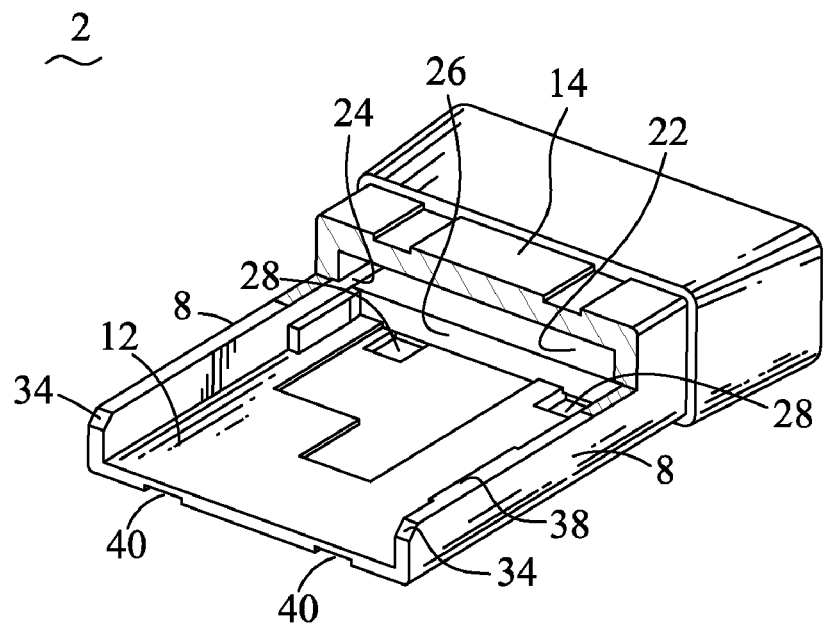
FIG. 3 shows a perspective view of a housing of the USB application being cut with a fixing wall and a front portion of a top wall.
Figure 6:
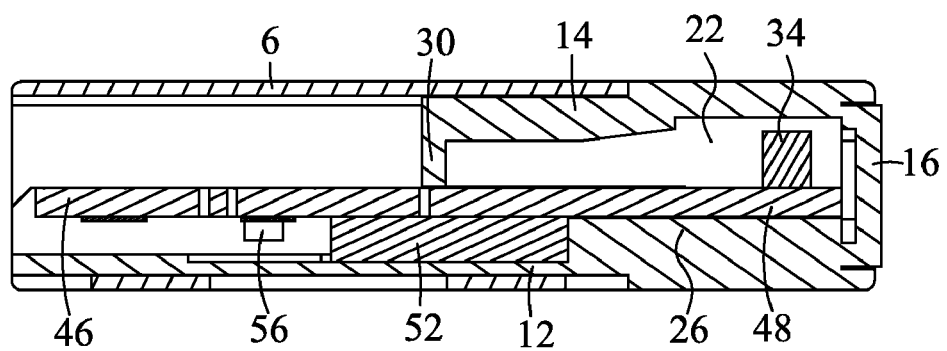
FIG. 6 is a cross-sectional view of the USB application device taken along line VI-VI in FIG. 1.

Please refer to FIG. 2, FIG. 3 and FIG. 6. The housing 2 has two side walls 8, a bottom wall 12, a top wall 14 and rear wall 16. Each of the two side walls 8 has a first portion 18 and a second portion 20. The height of the first portion 18 is higher than the height of the second portion 20. The first portions 18 of the two side walls 8 connect to the bottom wall 12, the top wall 14 and the rear wall 16 to form a receiving space 22.

Each of inner surfaces of the first portions 18 of the two side walls 8 is formed a channel 24. A supporting portion 26 is arranged inside the receiving space 22. Especially, the supporting portion 26 is projected from an inner surface of the bottom wall 12 and formed as one piece with the housing 2. In this case, the supporting portion 26 is a rectangular base. A top surface of the supporting portion 26 and the channel 24 are substantially at the same level.

Each of outer surfaces of the bottom wall 12 and the top wall 14 is formed at least two hollows 28. An inner surface of the top wall 14 extends a fixing wall 30. Especially, the fixing wall 30 perpendicularly extends from a front edge of the top wall 14 opposite the rear wall and towards the bottom wall 12. The opposite edge of the fixing wall 30 connects to the first portions 18 of two opposite side walls 8. A gap 32 is formed between the free edge of the fixing wall 30 and the bottom wall 12.

The projection 38 of the housing 2 is engaged into the concave 58 of the PCB 4 for preventing the PCB from shifting randomly. The edges of the PCB 4 also abut against the inner surfaces of two side walls 8 of the housing 2 respectively for preventing the PCB from shifting randomly.

Two first guiding portions 34 are formed at the corners at which the front edge connects to the edge of the second portions 20 of the side wall 8. A second guiding portion 36 is formed at the edge formed by the top wall 14 and the fixing wall 30. Especially, both the first guiding portion 34 and the second guiding portion 36 are slanted surfaces.

At least one projection 38 is projected from one of inner surfaces of the second portions 20 of the two opposite side walls 8. In this case, the projection 38 is projected from the inner surface of the second portion 20 of the side wall 8. At least one groove 40 is formed on the outer surface of the bottom wall 12. The groove 40 opens at a front edge of the bottom wall 12 and extends straight towards the rear wall 16. The groove 40 is aligned with one of the hollows 28 formed on the outer surface of the bottom wall 12.

The PCB 4 has a top surface 42, a bottom surface 44 opposite to the top surface 42, a front end portion 46 and a rear end portion 48 opposite to the front end portion 46. The top surface 42 of the front end portion 46 is disposed four contacts 50. The contacts 50 function as power contact (VCC), ground contact (GND) and differential signal transmission contacts (D+, D−) to comply with USB standard specification.

An integrated circuit (IC) 52 is located on the bottom surface 44 of the PCB 4 and between the front end portion 46 and the rear end portion 48. The IC 52 has a USB interface, a wireless interface and a transforming unit interconnecting the USB interface and the wireless interface (not shown in figures). In this case, the wireless interface is a Bluetooth interface. The transforming unit can receive a USB signal from the USB interface and transform the USB signal to a Bluetooth signal, and than send the Bluetooth signal to the wireless interface.

The transforming unit also can receive a Bluetooth signal from the wireless interface and transform the Bluetooth signal to a USB signal, and than send the USB signal to the USB interface. Hence, the transforming unit functions as a bridge between the USB interface and the wireless interface. Additionally, the wireless interface can be one of RFID, WiFi, WiMAX, ZigBee, GSM, GPRS, 3GPP, GPS.

The USB interface of the IC 52 connects the contacts 50 via a set of conducting traces (not shown in figures) printed on the PCB 4. The top surface 42 of the rear end portion 48 is disposed with an antenna 54 connecting to the wireless interface of the IC 52 via another conducting trace (not shown in figures). The antenna 54 can transmit and receive wireless Bluetooth signal.

The top surface 42, and the bottom surface 44 of the front end portion 46 are disposed with a plurality of electrical elements 56. A peripheral portion of the antenna 54 at the top surface 42 and the bottom surface 44 of the PCB 4 is not disposed with any electrical element 56 for preventing the antenna 54 from interference. One of the side edges of the front end portion 46 of the PCB 4 is formed as a concave 58.

The shell 6 has a top plate 60, a bottom plate 62 opposite to the top plate 60, a first side plate 64 and a second side plate 66 opposite to the first side plate 64. The first side plate 64 and the second side plate 66 respectively interconnect the opposite sides of the top plate 60 and the bottom plate 62. Hence, the shell 6 is of a sleeve-shape. The top plate 60 and the bottom plate 63 are formed with two wedges 68 respectively (only the wedges at the top plate are shown).

Figure 4:
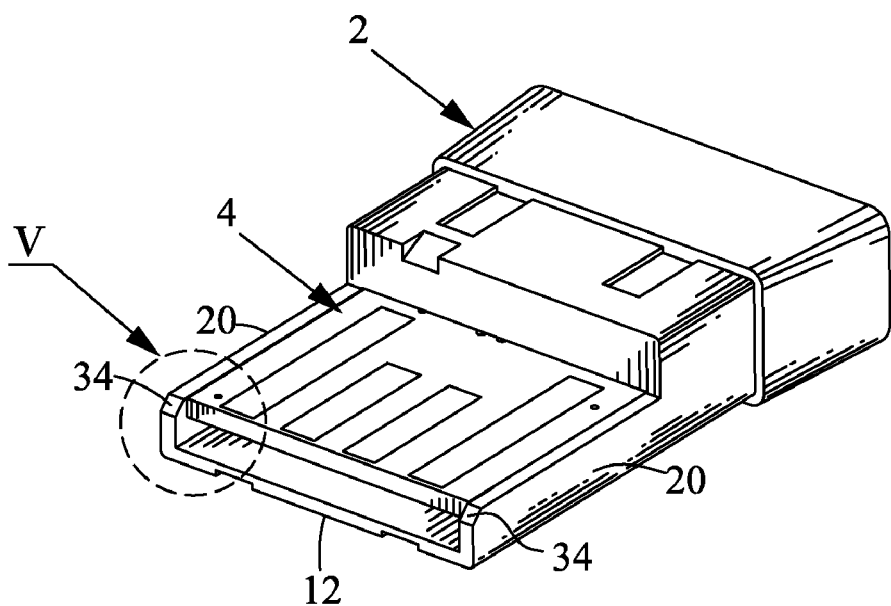
FIG. 4 shows a printed circuit board assembled to the housing.

Please refer to FIG. 2, FIG. 4 and FIG. 6. The fabricating method of the USB application device 100 is described as following. The rear end portion 48 of the PCB 4 is inserted into the receiving space 22 through the opening 32 of the housing 2 and meanwhile opposite edges of the PCB 4 are slid in the channels 24 formed on the inner surfaces of the first portions 18 of the two side walls 8 of the housing 2.

Therefore, the rear end portion 48 of PCB 4 is received in the receiving space 22 and the contacts 50 of the front end portion 4 of the PCB 4 are outside the receiving space 22. The edges of the PCB 4 are received and fixed in the channels 24 of the housing for preventing the PCB 4 from shifting randomly.

The rear end portion 48 of the PCB 4 is supported by the supporting portion 26. Hence, a top surface of the supporting portion 26 contacts the bottom surface 44 of the PCB 4. The IC 52 further has a printed surface and at least one side surface. Generally speaking, the printed surface is printed or carved with the serial number, the manufacturer's name, the manufacturer's mark of the IC 52. The printed surface of the IC 52 contacts the inner surface of the bottom wall 12 and the side surface of the IC 52 connects a front surface of the supporting portion 26 opposite to the rear wall 16.

Hence, the IC 52 supports the middle portion of the PCB 4 between the front end portion 46 and the rear end portion 48. The supporting portion 26 supports the rear end portion 48 the PCB 4. The IC 52 and the supporting portion 26 can together fix the PCB 4. The bottom edge of the fixing wall 30 contacts the top surface 42 of the PCB 4. The middle portion of the PCB 4 and the IC 52 are together sandwiched in the gap 32 of the housing 2 and between the bottom edge of the fixing wall 30 and the inner surface of the bottom wall 12.

Figure 5:
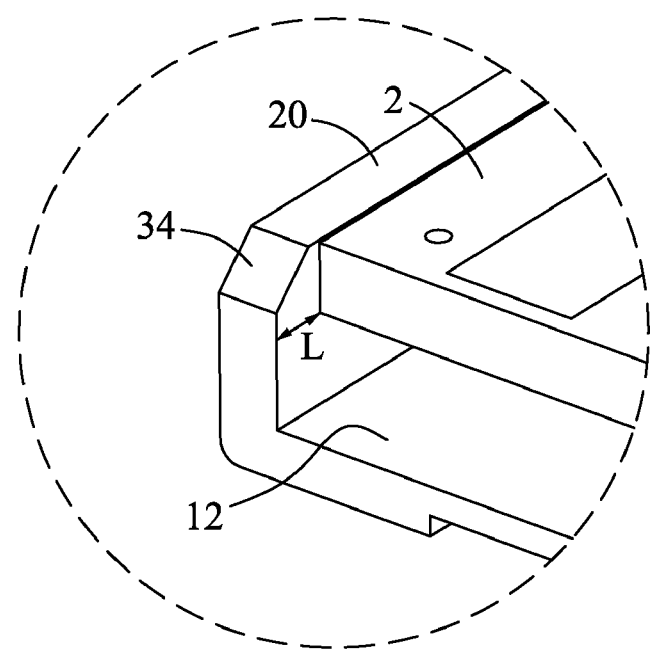
FIG. 5 is an enlarged view of a circle in FIG. 4.

Please refer to FIG. 5. There is a distance L between the front edge of the PCB 4 and the front edges of the two side walls 8. The second guiding portion 34 is formed between the front edge of the PCB 4 and the front edges of the side walls 8.

The front end portion 46 is located in a space defined by the bottom wall 12 and the second portions 20 of the two side walls 8. The top surface 42 of the PCB 4 and the top edges of the second portions 20 of the two side walls 8 are at the same level. Hence, the first end portion 46 of the PCB 4 is formed as a cantilever. Therefore, the PCB 4 is fixed to the housing 2.

The wedges 68 formed on the front plate 60 and the bottom plate 62 are guided by the second guiding portion 36 and the grooves 40 and then engaged into the hollows 28 formed on the top wall 14 and the bottom wall 12 of the housing 2. Therefore, the shell 6 is fixed with the housing 2 and the PCB 4.

The shell 6 completely covers the front end portion 46 of the PCB 4, the IC 52, the fixing wall 30 and the second portions 20 of the two side walls 8 of the housing 2, and partially covers the first portions 18 of the two side walls 8 of the housing 2.

Furthermore, there is not any supporting element or any front end protecting layer arranged between the bottom surface 44 of the front end portion 46 of the PCB 4 and the bottom wall 12 of the housing 2. The contacts 50, the front end portion 46 of the PCB 4 and the shell 6 together form as a standard A-type USB connector. The shell 6 can enhance ESD protection and therefore the USB application device 100 can comply with USB standard specification.

If the USB application device 100 couples to the electrical apparatuses, a carrying housing or a carrying board of a mating connector of the electronic apparatuses (not shown in figures) is guided to slide into a space between the top surface 42 of the PCB 4 and the shell 6 by the first guiding portion 36. Hence, mating contacts of the mating connector can couple to the contacts 50 of PCB 4 of the USB application device 100.

As described above, because the IC 52 is fixed on the second surface 44 and between the front end portion 46 and the rear end portion 48 of the PCB 4, and the printed surface of the IC 52 contacts the inner surface of the bottom wall 12 of the housing 2, the PCB 4 is supported by the IC 52. Because the IC 52 and the middle portion of the PCB 4 are sandwiched in the opening 32 and the free edge of the fixing wall 30 abuts against the top surface 42 of the middle portion of the PCB 4 opposite to the IC 52, the PCB 4 is fixed in the housing 2 and the strength of the PCB 4 that resists the external force is improved.

The supporting portion 26 supports the rear end portion 48 of the PCB 4 and the front surface of the supporting portion 26 abuts against the side surface of the IC 52 for improving the strength of the PCB 4 to resist the external force and fixing the PCB 4. The side edges of the PCB 4 are received in the channels 24 of the housing 2, the projection 38 of the housing 2 is engaged in the concave 58 of the PCB 4 for preventing the PCB 4 from shifting randomly.

The front end portion 46 of the PCB and the shell 6 together form as a A-type connector. The shell 6 can not only improve ESD protection of the USB application device 100 to comply with USB standard specification, but also improve the strength of the USB application device 100.

Because there is not any supporting element or any front end protecting layer arranged in the space between the bottom surface 44 of the front end portion 46 of the PCB 4 and the bottom wall 12 of the housing 2 for supporting the bottom surface 44 of front end portion 46 of the PCB 4, the design resource of the USB application will be reduced without concerning the location of the supporting element, the front end protecting layer, and the electrical element on the bottom surface 44 of the front end portion 46 of the PCB 4, and the space can additionally accommodate electrical element 56 for reducing the size of the USB application device 100.

Furthermore, the present invention is not limited to the embodiments described above; diverse additions, alterations and the like may be made within the scope of the present invention by a person skilled in the art. For example, respective embodiments may be appropriately combined.

What is claimed is:

1. A USB application device, comprising:
   a casing comprising
      a top wall, a bottom wall opposite to the top wall, a fixing wall extended from the top wall and towards the bottom wall and a gap formed between a bottom edge of the fixing wall and the bottom wall;
   a printed circuit board received in the casing and comprising
      a top surface, a bottom surface opposite to the top surface, a front end portion and a rear end portion opposite to the front end portion, the rear end portion of the printed circuit board being supported by a supporting portion formed in the casing;
   a plurality of contacts disposed on the top surface of the front end portion of the printed circuit board;
   an integrated circuit fixed on the bottom surface of a middle portion of the printed circuit board between the front end portion and the rear end portion, and electronically connected to the contacts, and having a printed surface; and
   wherein the integrated circuit and the middle portion of the printed circuit board are sandwiched in the gap of the casing, the printed surface of the integrated circuit contacts an inner surface of the bottom wall of the casing so as to support and fix the printed circuit board, and the bottom edge of the fixing wall contacts the top surface of the middle portion of the printed circuit board, and the supporting portion formed in the casing has a top surface connected to the bottom surface of the rear end portion of the printed circuit board and at least one side surface connected to a side surface of the integrated circuit.

2. The USB application device as claimed in claim 1, wherein the supporting portion is projected from the inner surface of the bottom wall and is of a rectangular base.

3. The USB application device as claimed in claim 1, further comprising an antenna fixed on the top surface of the rear end portion of the printed circuit board and electronically connected to the integrated circuit.

4. The USB application device as claimed in claim 1, wherein the casing has two opposite side walls connecting to side edges of the top wall and the bottom wall respectively, each of inner surfaces of the side walls is formed with a channel for receiving side edges of the printed circuit board, and the channel and the top surface of the supporting portion are at a same level.

5. The USB application device as claimed in claim 1, wherein the casing has two opposite side walls connecting to side edges of the top wall and the bottom wall respectively, at least one of inner surfaces of the side walls is formed with a projection for engaging into a concave formed on at least one of side edges of the printed circuit board.

6. A USB application device, comprising:
   a housing comprising
      a top wall, a bottom wall opposite to the top wall, a fixing wall extended from the top wall and towards the bottom wall and an opening formed between a bottom edge of the fixing wall and the bottom wall; and
      two opposite side walls, each of the side walls having a first portion with a first height and a second portion with a second height shorter than the first height, the first portions of the side walls interconnecting side edges of the top wall and the bottom wall to form a receiving space, and side edges of the fixing wall connecting to the first portions of the side walls respectively;

a printed circuit board comprising
- a top surface, a bottom surface opposite to the top surface, a front end portion and a rear end portion opposite to the front end portion, the top surface of the front end portion exposed outside the housing, and the rear end portion completely received in the receiving spaced formed in the housing and supported by a supporting portion formed in the receiving space;
- a plurality of contacts disposed on the top surface of the front end portion of the printed circuit board, the contacts being outside the receiving space;
- an integrated circuit fixed on the bottom surface of a middle portion of the printed circuit board between the front end portion and the rear end portion, and electronically connected to the contacts, and having a printed surface;
- a shell completely covering the front end portion of the printed circuit board, the integrated circuit and the fixing wall of the housing; and
- wherein the integrated circuit and the middle portion of the printed circuit board are sandwiched in the opening of the housing, the printed surface of the integrated circuit contacts an inner surface of the bottom wall of the housing so as to support and fix the printed circuit board, and the bottom edge of the fixing wall contacts the top surface of the middle portion of the printed circuit board, and the supporting portion formed in the receiving space has a top surface connected to the bottom surface of the rear end portion of the printed circuit board and at least on side surface connected to a side surface of the integrated circuit.

7. The USB application device as claimed in claim 6, wherein the housing is made of isolated material, and the shell is made of metal material.

8. The USB application device as claimed in claim 6, further comprising an antenna fixed on the top surface of the rear end portion of the printed circuit board and electronically connected to the integrated circuit.

9. The USB application device as claimed in claim 6, wherein the supporting portion is projected from the inner surface of the bottom wall and is of a rectangular base.

10. The USB application device as claimed in claim 9, wherein each of inner surfaces of the side walls is formed with a channel for receiving side edges of the printed circuit board, and the channel and the top surface of the supporting portion are at a same level.

11. The USB application device as claimed in claim 10, wherein at least one of inner surfaces of the side walls is formed with a projection for engaging into a concave formed on at least one of side edges of the printed circuit board.

12. The USB application device as claimed in claim 11, wherein each of corners formed between front edges and top edges of the second portions of the side walls respectively is formed with a first guiding portion.

13. The USB application device as claimed in claim 12, wherein the top surface of the printed circuit board and the top edges of the second portions of the two side walls are at a same level.

14. The USB application device as claimed in claim 13, wherein at least two wedges are formed on a top plate and a bottom plate of the shell respectively, at least two hollows are formed on the top wall and the bottom wall of the housing respectively for respectively engaging with the wedges of the shell.

15. The USB application device as claimed in claim 14, wherein a guiding surface is formed on an outer surface of a corner between the fixing wall and the top wall of the housing and aligned with the hollow formed on the top wall, a groove is straight formed on a bottom surface of the bottom wall with an opening at a front edge of the bottom wall, and aligned with the hollow formed on the bottom wall.

* * * * *